United States Patent
Jeng et al.

(10) Patent No.: US 7,320,946 B2
(45) Date of Patent: Jan. 22, 2008

(54) METHOD FOR GENERATING DYNAMIC MASK PATTERN

(75) Inventors: Jeng-Ywan Jeng, Taipei (TW); Jia-Chang Wang, Taipei (TW); Chang-Ho Shen, Hsinchu (TW)

(73) Assignee: National Taiwan University of Science and Technology, Taipei (TW)

( * ) Notice: Subject to any disclaimer, the term of this patent is extended or adjusted under 35 U.S.C. 154(b) by 196 days.

(21) Appl. No.: 11/160,921

(22) Filed: Jul. 15, 2005

(65) Prior Publication Data

US 2005/0244727 A1    Nov. 3, 2005

Related U.S. Application Data

(62) Division of application No. 10/707,628, filed on Dec. 25, 2003, now abandoned.

(30) Foreign Application Priority Data

Oct. 16, 2003  (TW) ............................... 92128666 A

(51) Int. Cl.
*H01L 21/30* (2006.01)
*G03F 9/00* (2006.01)

(52) U.S. Cl. ............................ 438/800; 430/5; 716/21; 257/E21.38

(58) Field of Classification Search ................. 438/800; 430/5; 716/19, 21
See application file for complete search history.

(56) References Cited

U.S. PATENT DOCUMENTS

| 5,105,215 A * | 4/1992 | Liu .............................. 355/40 |
| 2002/0192572 A1* | 12/2002 | Lau ................................ 430/5 |
| 2004/0265707 A1* | 12/2004 | Socha ........................... 430/5 |

\* cited by examiner

*Primary Examiner*—Alexander Ghyka
(74) *Attorney, Agent, or Firm*—Jiang Chyun IP Office

(57) ABSTRACT

A dynamic mask module is disclosed, which comprises a microcomputer system, a mask pattern generator and a light source. The mask pattern generator is disposed over a substrate and electrically connected to the microcomputer system. The microcomputer system transmits an image signal to the mask pattern generator. The light source is disposed over the mask pattern generator to a photo-resist layer on the substrate. The mask pattern generated by the dynamic mask module is a dynamic image and the mask pattern can be changed on anytime. In addition, the manufacturing cost can be and the manufacturing time can be reduced.

2 Claims, 3 Drawing Sheets

METHOD FOR GENERATING DYNAMIC MASK PATTERN

CROSS-REFERENCE TO RELATED APPLICATION

This application is a divisional of a prior application Ser. No. 10/707,628, filed Dec. 25, 2003, now abandoned, which claims the priority benefit of Taiwan application serial no. 92128666, filed Oct. 16, 2003.

BACKGROUND OF THE INVENTION

1. Field of the Invention

The present invention relates to a mask module, and more particularly to a dynamic mask module for generating dynamic mask patterns.

2. Description of the Related Art

During semiconductor fabrication, photolithography is an essential process. Usually, whether a technology is complicate can be determined by the number of the lithographic process and mask. A mask is made from transparent glass and a patterned Cr layer is formed thereon. When a light source is applied thereto, the mask pattern can be transferred to the photo-resist on the substrate.

For high resolution, uniformity of light, stability and quality of mask are key factors thereof. Traditionally, the mask patterns are taped out to the mask manufacturing companies for fabricating masks. The number of the mask depends on the complexity of the technology. The cost of mask depends on the resolution of line width; that is also the main reason that causes the high cost of mask.

For fabricating a semiconductor product, at least on mask is required depending on the complexity of the technology. Therefore, during the process loading and unloading masks increase process time. Additionally, an alignment step is required after a mask is changed, or misalignment of different layers occurs. Moreover, traditional gray-level mask uses special and expensive material for obtaining different exposure depths which is also a reason causing high cost of fabrication.

For example, in rapid prototyping (RP), physical application of the stereolithography printing process takes place via a commercial system known as a stereolithography apparatus (SLA), manufactured by 3D Systems, Inc., Valencia, Calif. It uses ultraviolet hardening resin via scanning mirror and takes a long time. In order to improve process time, solid ground curing (SGC) with ultraviolet is applied by using surface exposure. It includes: mask plotter cycle and mold growth cycle for reducing process time. The method comprises: receiving cross-sectional data, performing image process, forming covering plate and forming image by static reflection loading. Although SGC can improve the process time, the time for loading and unloading masks and alignment steps are still required.

SUMMARY OF THE INVENTION

Therefore, the object of the present invention is to provide a dynamic mask module, which is adapted to generate dynamic mask patterns and applied to exposure, development of semiconductor manufacturing process and surface exposure rapid prototyping, for reducing fabrication cost and process time.

To meet the object described above, the present invention discloses a dynamic mask module adapted to transfer a mask pattern to a photo-resist on a substrate. The dynamic mask module comprises: a microcomputer system; a mask pattern generator; and a light source. The mask pattern generator is disposed over the substrate and electrically connected to the microcomputer system. The microcomputer system transmits an image signal of the mask pattern to the mask pattern generator for generating pluralities of opaque areas and transparent areas and outputting the mask pattern. The light source is disposed over the mask pattern generator and light of the light source projects on the opaque areas and transparent areas for transferring the mask pattern to the photo-resist.

In the preferred embodiment of the present invention, a focusing lens is disposed between the mask pattern generator and the substrate adapted to minify or magnify the image of mask pattern. In addition, the mask pattern generator is, for example, a transmissive LCD or a DLP optical projector. Moreover, the light source is, for example, ultraviolet or visible light.

To reach the object described above, the present invention further discloses a method for generating a dynamic mask pattern, which comprises: providing a single-layer contour pattern having an outside contour and at least one inside contour; identifying the outside contour and the inside contour; establishing a figure window and filling color therein; establishing the outside contour and the inside contour and filling color therein; and sequentially attaching the outside contour and the inside contour filled with color to the figure window for forming a mask pattern.

In the preferred embodiment of the present invention, the method further comprises, for example, filling black in the figure window after establishing the figure window. In addition, the method further comprises filling white within the outside contour and filling black within the inside contour after establishing the outside contour and the inside contour.

In the preferred embodiment of the present invention, the method further comprises transferring the mask pattern into an image signal and transmitting the image signal to a mask pattern generator for generating pluralities of opaque areas and transparent areas and outputting the mask pattern after sequentially attaching the outside contour and the inside contour filled with color to the figure window for forming a mask pattern.

To achieve the object described above, the present invention further discloses a layer process, comprising: (a) providing a substrate; (b) forming a photo-resist layer on the substrate; (c) transmitting an image signal of a mask pattern from a microcomputer system to a mask pattern generator, the mask pattern generator outputting the mask pattern; (d) performing an exposure step for transferring the mask pattern to the photo-resist layer; and (e) performing a development step for removing a portion of the photo-resist layer and forming a patterned photo-resist layer as same as the mask pattern.

In the preferred embodiment of the present invention, the method, after step (e), further comprises: (f) forming a supporting layer on the patterned photo-resist layer for planarizing the patterned photo-resist layer; (g) forming another photo-resist layer on the supporting layer; (h) transmitting an image signal of another mask pattern from the microcomputer system to the mask pattern generator, the mask pattern generator outputting the another mask pattern; (i) performing another exposure step for transferring the another mask pattern to the another photo-resist layer; (j) performing another development step for removing a portion of the another photo-resist layer and forming another patterned photo-resist layer as same as the another mask pattern; and (k) removing the supporting layer. Additionally, before step (k) it further comprises at least repeating steps (f)-(j) once.

In the preferred embodiment of the present invention, the light source of the layer process is, for example, a point light source or a surface light source, wherein when the light source is a point light source, the method further comprises modifying a gray level of the mask pattern outputted from the mask pattern generator for generating a gray level of a central area of the mask pattern less than that of a field area thereof. In addition, the method further comprises temporarily turning off a transparent area within a central area of the mask pattern generator for unifying exposure energy. Therefore, light passing through the mask pattern generator is unified.

In order to make the aforementioned and other objects, features and advantages of the present invention understandable, a preferred embodiment accompanied with figures is described in detail below.

DESCRIPTION OF SOME EMBODIMENTS

Figure 1:
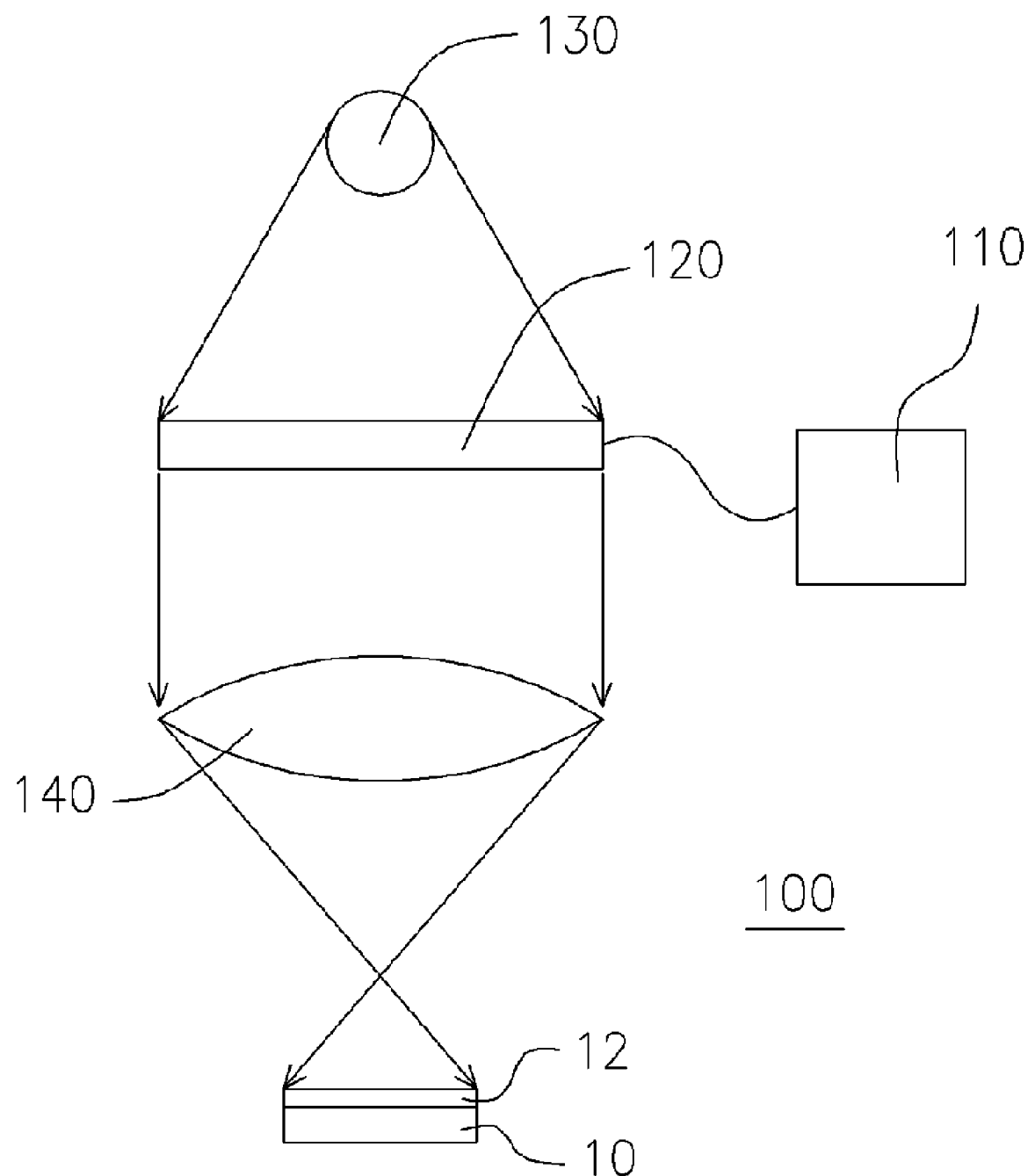
FIG. 1 is a schematic drawing showing a preferred dynamic mask module of the present invention.

FIG. 1 is a schematic drawing showing a preferred dynamic mask module of the present invention. Referring to FIG. 1, the dynamic mask module 100 comprises a microcomputer system 110; a mask pattern generator 120; and a light source 130. The mask pattern generators 20 is disposed over a substrate 10 and electrically connected to the microcomputer system 110. The microcomputer system 110 transmits an image signal of the mask pattern to the mask pattern generator 120 for generating pluralities of opaque areas and transparent areas and outputting the mask pattern. The light source 130 is, for example, ultraviolet or visible light, which is disposed over the mask pattern generator 120 and light of the light source 130 projects on the opaque areas and transparent areas for transferring the mask pattern to a photo-resist 12 on the substrate 10.

In order to minify and magnify the image of mask pattern, a focusing lens 140 is disposed between the mask pattern generator 120 and the substrate 10.

As the descriptions mentioned above, the mask pattern generator 120 is, for example, a transmissive LCD controlling pixel electrodes via thin film transistors for generating pluralities of opaque and transparent areas and outputting the mask pattern. In addition, the mask pattern generator 120 is, for example, a digital light processing (DLP) optical projector the angles of the reflective mirrors via the digital mirror display within the optical projector and outputting the mask pattern.

Referring to FIG. 1, the microcomputer system 110 transmits an image signal of the mask pattern from to the mask pattern generator 120 for generating an image as same as the mask pattern. Therefore, the mask pattern generator 120 can generate different mask patterns by setting the microcomputer system 110 and be deemed as a dynamic mask. During manufacturing devices, the traditional glass masks deposited with Cr are not required and there is not alignment issue. Accordingly, the manufacturing cost and process time are reduced. The method of generating the dynamic mask pattern via the microcomputer 110 is described below.

Figures 2A, 2B, 2C:
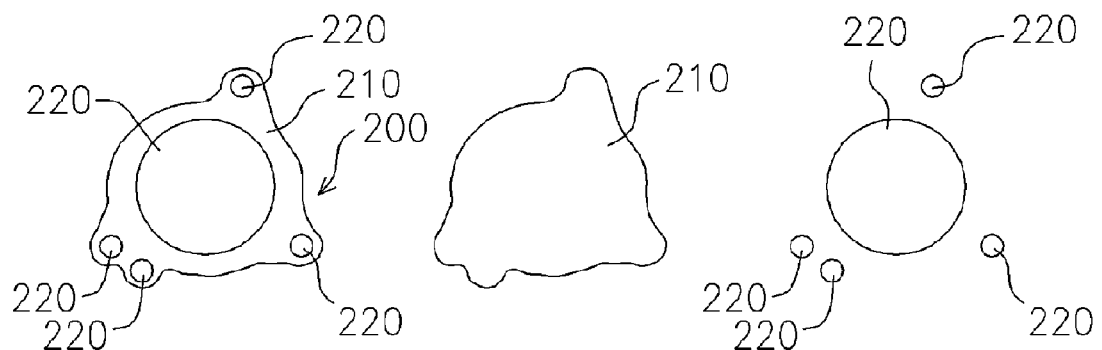
FIGS. 2A-2I are a schematic process flow showing a preferred method for generating the dynamic mask pattern.
Figures 2D, 2E, 2F:
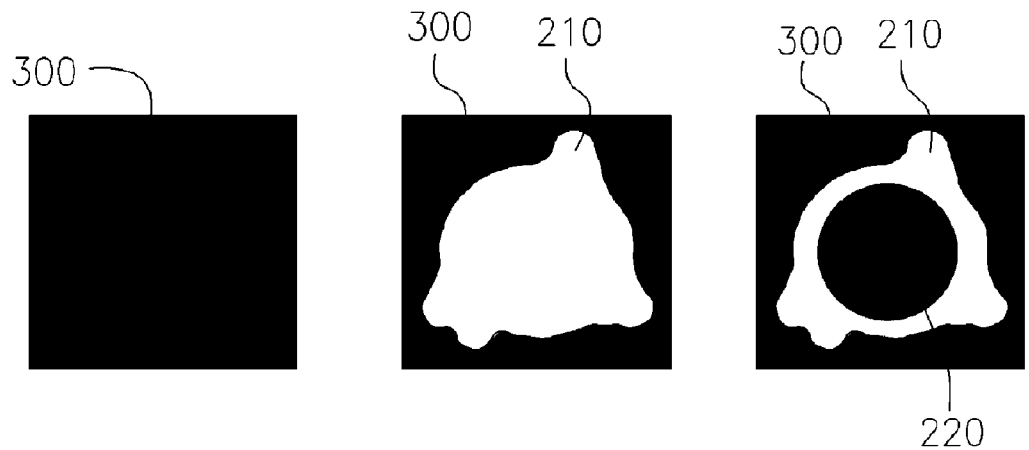
Figures 2G, 2H, 2I:
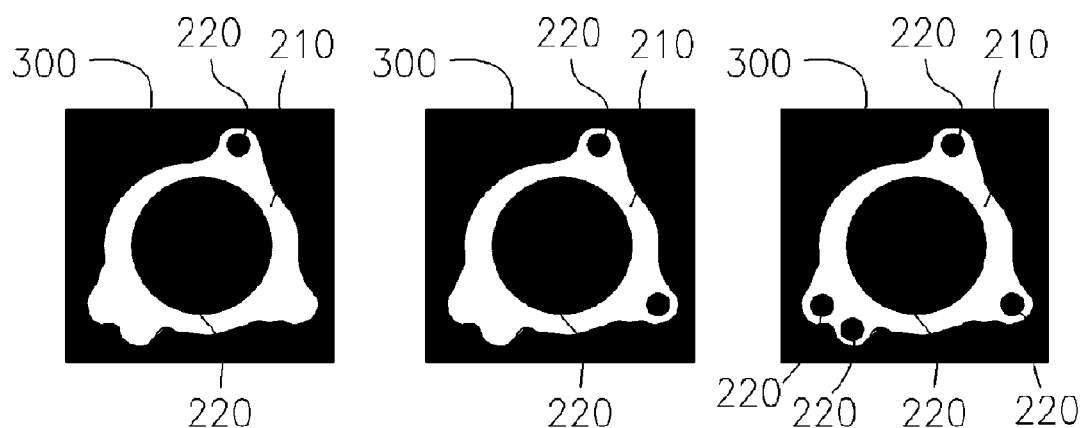

FIGS. 2A-2I are a schematic process flow showing a preferred method for generating the dynamic mask pattern. First, a single-layer contour pattern 200 is provided as shown in FIG. 2A, which has an outside contour 210 and at least one inside contour 220. There are four inside contours in the embodiment. The method of generating the single-layer contour pattern 200 can, for example, comprise: outputting STL files by CAD; compiling polygon operation files of the STL files by AUTOEDIT within RP E-DARTS; and unpolygonizing the files into the single-layer contour 200 consisted of HPGL files. Then, the outside contour 210 and the inside contour 220 are identified as shown in FIGS. 2B and 2C. A figure window 300 is established and color, such as black, is filled therein as shown in FIG. 2D. Then, the outside contour 210 and the inside contour 220 are established, and, for example, white is filled into the outside contour 210 and black is filled into the inside contour 220. Finally, the color-filled outside contour 210 is attached to the figure window 300 as shown in FIG. 2E and the color-filled inside contour 220 is sequentially attached to the figure window 300 as shown in FIGS. 2F-2I for constituting a mask pattern. The image signal of the mask pattern then can be transmitted to the mask pattern generator 120 by the microcomputer 110 for outputting the mask pattern.

The mask pattern generated by the dynamic mask module of the present invention can be applied to exposure, development of semiconductor manufacturing process, surface exposure rapid prototyping technology, or any other filed, such as Lens or V-Groove). Following is a method for forming a patterned photo-resist.

Figure 3:
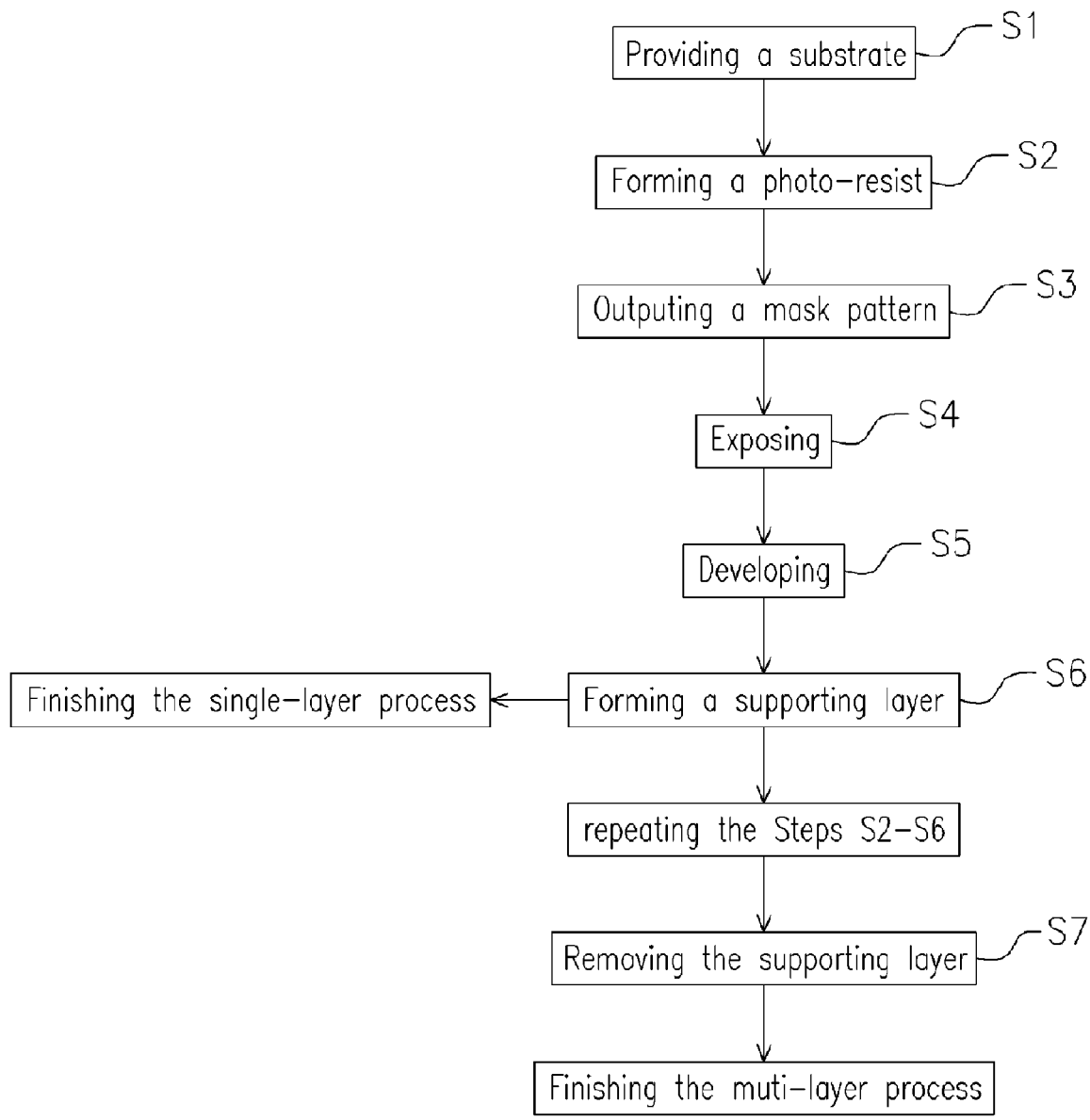
FIG. 3 is a schematic process flow showing a preferred method for forming a patterned photo-resist.

FIG. 3 is a schematic process flow showing a preferred method for forming a patterned photo-resist. Referring to FIG. 3, a substrate is provided at step S1. A photo-resist layer is formed on the substrate in step S2. In step S3, a mask pattern is outputted by transmitting an image signal of the mask pattern from the microcomputer system 110 to the mask pattern generator 120, such as transmissive LCD or DLP optical projector, as shown in FIG. 1. The mask pattern generator 120 generates pluralities of opaque and transparent areas and outputs the mask pattern. An exposure step is performed in step S4 for transferring the mask pattern to the photo-resist layer. A development step, for example, with developer is performed in step S5 for removing a portion of the photo-resist layer and forming a patterned photo-resist layer as same as the mask pattern. Therefore, the single-layer process is complete.

For performing multi-layer process and fabricating 3-D device, after step S5, the method further comprises: forming a supporting layer on the patterned photo-resist layer for planarizating the patterned photo-resist layer is step S6. Another photo-resist layer is formed on the supporting layer. Then, an image signal of another mask pattern is transmitted from the microcomputer system to the mask pattern generator and the mask pattern generator outputs the another mask pattern. Another exposure step is performed for transferring the another mask pattern to the another photo-resist layer. Another development step is performed for removing a portion of the another photo-resist layer and forming another patterned photo-resist layer as same as the another mask pattern. Finally, the supporting layer is removed in step S7. Therefore, the multi-layer process is finished.

Accordingly, the supporting layer planarizes the patterned photo-resist layer and supports the forming the second patterned photo-resist layer. Then, the repetition of steps S2-S6 can generate additional mask pattern for forming a multi-layer structure.

It should be noted that the light source of the layer process is, for example, a point light source. Because a point light source generates high intensity at the central area of the mask pattern generator 120, the light intensity will not be unified when the mask pattern generator 120 has same gray level for all areas. Therefore, during the exposure step, the gray level of the mask pattern outputted from the mask pattern generator 120 can be modified for generating a gray level of a central area of the mask pattern less than that of a field area thereof. The method of modifying the gray level of the mask pattern via the mask pattern generator 120 can avoid the cost stemming from the use of specific mask and obtain different exposure depth.

One with ordinary skill in the art will understand that unifying light passing through the mask pattern generator 120 can be achieved by temporarily turning off the transparent area within a central area of the mask pattern generator for unifying exposure energy.

Accordingly, the dynamic mask module can generate dynamic mask patterns and be applied to exposure, development of semiconductor manufacturing process and surface exposure rapid prototyping technology. Therefore, the process time can be reduced and no traditional mask is required for forming 3-D microstructure. Moreover, no alignment issue during manufacturing exists. The cost of fabrication and process time are both reduce. Additionally, the mask pattern generator of the present invention can generates a mask pattern having different gray level by modifying the gray level of the mask pattern outputted from the mask pattern generator. Therefore, different exposure depths are formed during an exposure process.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for generating a dynamic mask pattern, comprising:
   providing a single-layer contour pattern having an outside contour and at least one inside contour;
   identifying the outside contour and the inside contour;
   establishing a figure window and filling color therein;
   establishing the outside contour and the inside contour and filling color therein; and
   sequentially attaching the outside contour and the inside contour filled with color to the figure window for forming a mask pattern.

2. The method for generating a dynamic mask pattern of claim 1, further comprising transferring the mask pattern into an image signal and transmitting the image signal to a mask pattern generator for generating pluralities of opaque areas and transparent areas and outputting the mask pattern.

* * * * *